(12) United States Patent
Yang

(10) Patent No.: US 10,128,865 B1
(45) Date of Patent: Nov. 13, 2018

(54) TWO STAGE DIGITAL-TO-ANALOG CONVERTER

(71) Applicant: MACRONIX INTERNATIONAL CO., LTD., Hsinchu (TW)

(72) Inventor: Yih-Shan Yang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/658,745

(22) Filed: Jul. 25, 2017

(51) Int. Cl.
*H03M 1/66* (2006.01)

(52) U.S. Cl.
CPC .................................. *H03M 1/66* (2013.01)

(58) Field of Classification Search
CPC ....................................................... H03M 1/66
USPC .......................... 341/144, 145, 118, 120, 154
See application file for complete search history.

(56) References Cited

U.S. PATENT DOCUMENTS

| | | | |
|---|---|---|---|
| 5,831,566 A * | 11/1998 | Ginetti | .................. H03M 1/682 341/144 |
| 5,852,360 A * | 12/1998 | Levinson | ................. G05F 3/245 323/314 |
| 5,894,281 A | 4/1999 | Toda | |
| 6,188,212 B1 | 2/2001 | Larson et al. | |
| 6,246,221 B1 | 6/2001 | Xi | |
| 6,600,299 B2 | 7/2003 | Xi et al. | |
| 7,282,902 B2 | 10/2007 | Chang et al. | |
| 7,283,082 B1 | 10/2007 | Kuyel | |
| 7,551,112 B2 | 6/2009 | Choi et al. | |
| 7,573,411 B2 | 8/2009 | Shin et al. | |
| 7,928,871 B2 | 4/2011 | Aruga et al. | |
| 8,054,302 B2 | 11/2011 | Kim et al. | |
| 8,089,261 B2 | 1/2012 | Lipka | |
| 8,618,971 B1 | 12/2013 | Li | |
| 8,710,813 B2 | 4/2014 | Yang et al. | |
| 8,760,131 B2 | 6/2014 | van Ettinger et al. | |
| 9,069,370 B2 | 6/2015 | Soenen et al. | |
| 9,170,592 B2 | 10/2015 | Seymour et al. | |
| 9,239,584 B2 | 1/2016 | Lerner et al. | |
| 9,261,892 B2 | 2/2016 | Wang et al. | |
| 9,310,816 B2 | 4/2016 | Chang et al. | |

(Continued)

OTHER PUBLICATIONS

"Low-dropout regulator," https://en.wikipedia.org/wiki/Low-dropout_regulator?oldid=767916335; Feb. 28, 2017, 5 pages.

(Continued)

*Primary Examiner* — Peguy Jean Pierre
(74) *Attorney, Agent, or Firm* — Haynes Beffel & Wolfeld LLP

(57) ABSTRACT

An N bit digital-to-analog converter DAC is based on a first stage including a first set of resistors corresponding to higher order bits of the digital input, and a second stage including a second set of resistors corresponding to lower order bits of the digital input. A plurality of pass transistors is arrange to connect a first subset of the first set of resistors in the first stage selected in response to a digital input to a second subset of the second set of resistors in the second stage selected in response to the digital input. A means for reducing variations in a sum of on-resistances $R_{ON}$ of the pass transistors in the plurality of pass transistors selected in response to a digital input is provided, resulting in more uniform steps in output voltage of the DAC over a wider range.

18 Claims, 4 Drawing Sheets

(56) References Cited

U.S. PATENT DOCUMENTS

| | | |
|---|---|---|
| 9,471,078 B1 | 10/2016 | Guan et al. |
| 9,553,548 B2 * | 1/2017 | Park et al. |
| 9,825,644 B2 * | 11/2017 | Kim .................. H03M 1/66 |
| 2010/0026251 A1 | 2/2010 | Lam et al. |
| 2010/0237839 A1 | 9/2010 | Gurcan |
| 2011/0121802 A1 | 5/2011 | Zhu |
| 2012/0306506 A1 | 12/2012 | Kiuchi |
| 2014/0340067 A1 | 11/2014 | Zhong et al. |
| 2015/0035505 A1 | 2/2015 | Peluso |
| 2017/0077808 A1 | 3/2017 | Iwai et al. |

OTHER PUBLICATIONS

"Operational Amplifier," https://en.wikipedia.org/wiki/Operational_amplifier, downloaded on May 1, 2017, 22 pages.
Sanchez-Sinencio, "Low Drop-Out (LDO) Linear Regulators: Design Considerations and Trends for High Power-Supply Rejection (PSR)," IEEE Santa Clara Valley Solid Circuits Society, Feb. 11, 2010, 47 pages.
Zumbahlen, The Linear Circuit Design Handbook, Chapter 1, Analog Devices, Inc., Mar. 13, 2008, 104 pages.
Office Action in U.S. Appl. No. 15/658,286 dated Feb. 23, 2018, 8 pages.
U.S. Appl. No. 15/641,167—Office Action dated Jan. 17, 2018, 9 pages.
U.S. Office Action in U.S. Appl. No. 15/673,644 dated Mar. 21, 2018, 8 pages.

\* cited by examiner

TWO STAGE DIGITAL-TO-ANALOG CONVERTER

BACKGROUND

Field

The present invention relates to digital-to-analog converters DACs suitable for implementation on integrated circuits.

Description of Related Art

A digital-to-analog converter DAC receives a digital input representing a voltage level, and converts that digital input to an analog signal. A DAC that is capable of producing an analog signal with high resolution, based on a large digital input can be complex, and can require a significant amount of area on an integrated circuit.

One type of DAC has been developed based on a string of resistors of constant value. The string of resistors can be driven by an operational amplifier configured in a negative feedback configuration, where the output voltage level is a function of a selected number of resistors in the string. A bypass node on each resistor is connected to a pass transistor connecting the node to a feedback node in the circuit at which a relatively constant feedback voltage is maintained. The number of resistors selected in the string for a given digital input is determined by which pass transistor is enabled by an input decoder.

The accuracy of each step in the output voltage in resistor string DAC is a function of the uniformity of the resistance of each resistor in the string. For high resolution required for decoding a relatively large digital input, the number of resistors in the string and the number of pass transistors required can get very high. For example, a 10 bit input can require $(2^{10}-1)$ or 1023 precision resistors arranged in series and $2^{10}$ pass transistors. Very large number of resistors and pass transistors makes manufacturing with high uniformity difficult, and requires a large area on the integrated circuit.

In order to reduce the number of resistors required, a resistor string DAC can be implemented in two stages, where the upper stage includes $2^{N-M}-1$ resistors in series, and the lower stage requires $2^M$ resistors in series. For the 10 bit example, where M is 2, an upper stage including $2^8-1$ resistors and a lower stage including $2^2$ resistors can be used for total of 259 resistors. There is also a reduction in the number of pass transistors required. However, a two-stage resistor string DAC requires a more complex configuration of pass transistors, including at least two pass transistors for each selected resistance value. Also, the resistance of the pass transistors is part of the feedback loop, so that variations in the on-resistance of selected pass transistors can reduce the accuracy and uniformity of changes in the output voltage level.

It is desirable to provide a lower cost, high resolution and high accuracy DAC suitable for use in integrated circuits.

SUMMARY

Improved digital to analog converters DAC based on resistor strings are described which can be made with high resolution and high accuracy, and relatively low cost.

An embodiment of a DAC described herein includes multiple stages of resistor strings, including at least a first stage in the second stage. A first stage can have a string of resistors that correspond with higher order steps in the output voltage, and a second stage can have a string of resistors that correspond with lower order steps in the output voltage. Pass transistors are configured to couple the first and second stages so that various combinations of resistors in the first and second stages are provided in response to the digital input signals. A means is provided in various configurations for reducing variations in a sum of the on-resistances $R_{ON}$ of the pass transistors used for any particular digital input. As a result, the accuracy of the DAC is improved.

A DAC is described having two stages, comprising an amplifier having a first input connected to a voltage reference and a second input connected to a feedback signal, which generates an output voltage on an output the node. The first stage includes a first set of resistors connected in series between the output node and a second node in the circuit, that is intermediate between the first and second stages. The first set of resistors can have $(2^{N-M}-1)$ members which in some embodiments can consist of resistors having identical resistance RD.

A second set of resistors is connected in series between the second node in the circuit, and a third node. The second set of resistors has $(2^M-1)$ members which in some embodiments can consists of resistors having identical resistance equal to RD/M.

A feedback circuit is connected between the third node and a power supply reference voltage such as ground. The feedback circuit provides the feedback signal to the amplifier as a function of the voltage at the third node.

Pass transistors are configured to select a pair of pass transistors in response to a digital input signal, to connect a subset of resistors from the first set and a subset of resistors from the second set in series between the output node and the third node, for each value of the digital input. An embodiment is described having first group of pass transistors having $(2^{N-M})$ members is coupled with the first set of resistors; and having a second group of pass transistors having $(2^M)$ members is coupled with the second set of resistors. The pass transistors in the first group are connected between respective nodes of the resistors in the first set and the second node. The pass transistors in the second group are connected between respective nodes of the resistors in the second set and the second node. Thus, a pair of pass transistors including one member of the first group and one member of the second group is used to couple the two stages together. The decoder is connected to a digital input and supplies gate voltages to different selected pairs of pass transistors for different values of the digital input. Each selected pair includes a pass transistor in the first group selected in response to the higher order bits of the digital input, and a pass transistor in the second group selected in response to the lower order bits of the digital input.

In one embodiment, the sum of the on-resistances $R_{ON}$ of the selected pairs of pass transistors is made more uniform by implementing pass transistors in at least the second group with different effective sizes. For example, the pass transistors in the second group include transistors T(i), for i from 2M to 1, connected respectively to outputs of the decoder corresponding to decoded values of the lower order M input bits of the digital input, and the effective size of transistor T(i) for any given transistor in the group corresponding to a first value of the lower order bits of the input signal, is greater than the effective size of transistor T(i−1) which corresponds to a second value lower than the first value of the lower order bits. As a result, the on-resistance of the transistor T(i) is less than on-resistance of transistor T(i−1) when selected. This in effect offsets the variations in the on-resistance of pass transistors in the first group that occurs because the voltages on the second node vary is a function of the subset of the second set of resistors included in the string according to the lower order bits of the digital input signal.

In another embodiment, the decoder is arranged to apply a gate voltages to selected pass transistors having a voltage level that is a function of the digital input signal. In one example, the gate voltage applied to a pass transistor in the first group is set at a value in response to the lower order bits of the digital input signal. This manner, the overdrive voltage on the pass transistors can be made more constant, reducing variations in the on-resistance of selected pass transistors.

Other aspects and advantages of the present invention can be seen on review of the drawings, the detailed description and the claims, which follow.

DETAILED DESCRIPTION

A detailed description of embodiments of the present invention is provided with reference to the FIGS. 1-6.

Figure 1:
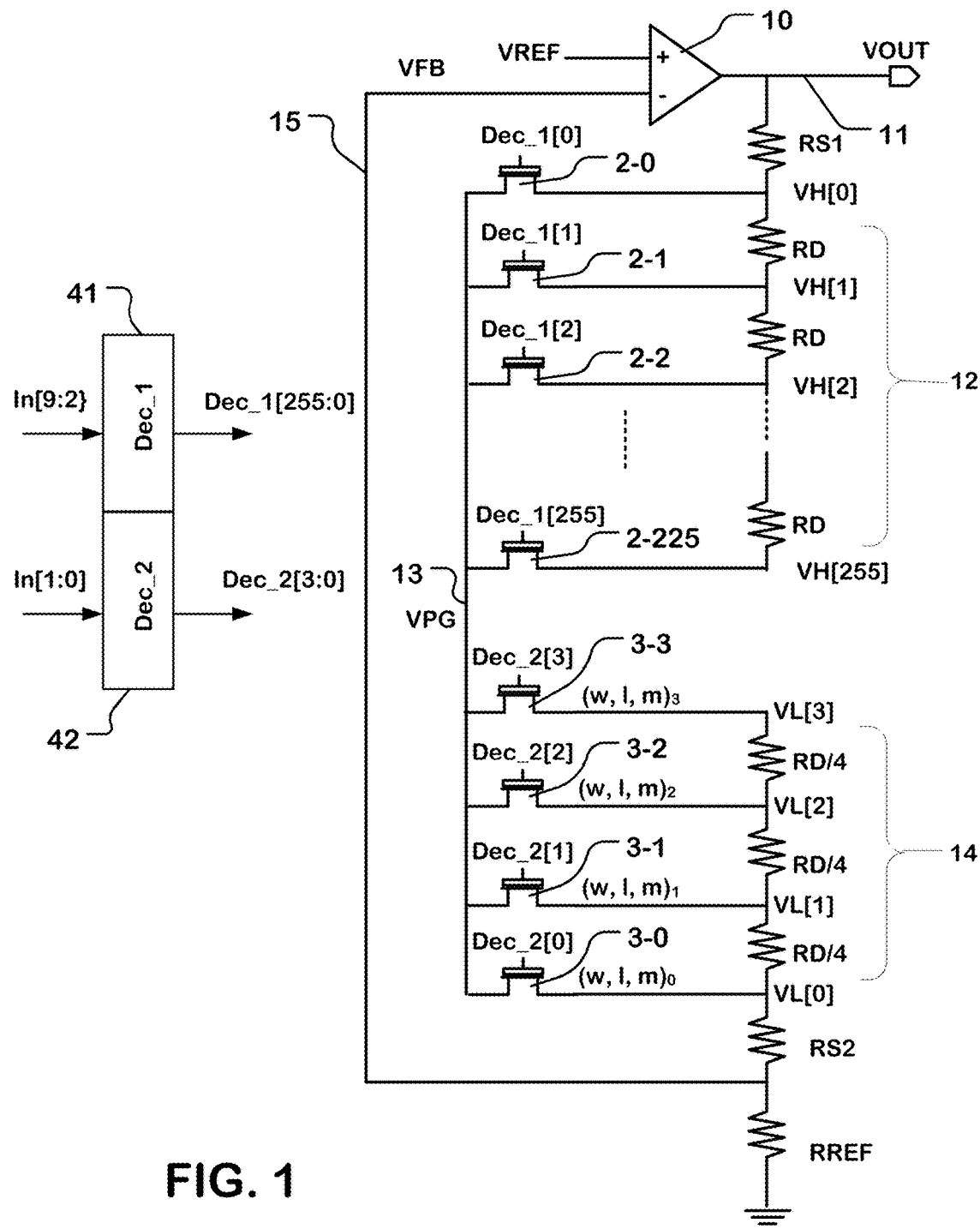
FIG. 1 is a schematic diagram of a two-stage DAC including technology described herein.

FIG. 1 is a schematic diagram of a two-stage, N-bit DAC (N=10 in this example) including means for reducing variations in a sum of on-resistances $R_{ON}$ of selected pairs of pass transistors as mentioned above. For the purposes of example only, the circuit can be configured to produce an output voltage up to 25 volts in a 10 bit embodiment, with 1024 steps of about 24.4 milliVolts each.

The circuit includes an operational amplifier 10 which generates an analog output VOUT on node 11. The inputs to the operational amplifier 10 include a reference voltage VREF on the "+" input terminal, and a feedback voltage VFB on the "−" input terminal. The reference voltage VREF can be generated using a bandgap reference or other type of stable voltage reference. The feedback voltage VFB is generated on the resistor string as described below.

A string of resistors is connected between the node 11 on the output of the operational amplifier 10 and a feedback, third node on a reference resistor RREF. The string of resistors includes a first voltage shift resistor RS1, a first set 12 of DAC resistors connected in series between the output node and an intermediate, second node 13, a second set 14 of DAC resistors connected in series between the second node 13 and the third node 15, and a second voltage shift resistor RS2. The resistors in the first set 12 of DAC resistors have uniform resistance RD, where uniform resistance is understood to include some variations given the purpose of the digital-to-analog converter. The voltage shift resistors RS1 and RS2 can be used to adjust the output voltage range according to a design requirement for a specific implementation, and may be optional for any particular implementation.

Taking the aforementioned N-bit DAC (N=10), for example, the first set 12 of DAC resistors has ($2^{N-M}-1$) members, which for a 10-bit DAC in which M is 2, equals 255. The second set 14 of DAC resistors has ($2^M-1$) members, which for a 10-bit DAC in which M is 2, equals 3. The resistors in the first set 12 of DAC resistors have uniform resistance RD. The resistors in the second set 14 of resistors have uniform resistance RD/4, where the denominator 4 is $2^M$.

A feedback circuit includes the resistor RREF connected between the third (feedback) node 15 and a power supply reference voltage such as ground, relative to the output voltage VOUT, and a signal line connecting the feedback voltage VFB to the operational amplifier 10. This feedback circuit supplies VFB as a function of the voltage at the third node 15, which is determined by current through the resistor RREF and a selected subset of the first and second sets of resistors. In this example, the voltage at the third node 15 is supplied directly to the operational amplifier 10 as VFB. In other embodiments, there may be other circuit elements in the feedback path.

The circuit includes a first group of pass transistors having ($2^{N-M}$) members, including pass transistors 2-0, 2-1, 2-2, . . . 2-255 in this example. The pass transistors in the first group are connected between respective higher order voltage nodes VH[0] to VH[N−M−1] of the series connected resistors in the first set of resistors, and the second node 13.

The circuit includes a second group of pass transistors having ($2^M$) members, including pass transistors 3-0, 3-1, 3-2, 3-3 in this example. The pass transistors in the second group are connected between the second node 13 and lower order voltage nodes VL[M−1] to VL[0] in the series connected resistors in the second set of resistors.

The DAC includes a decoder, which includes a higher order decoder 41 and a lower order decoder 42. The N-bit digital input signal In[N−1:0] is divided into a higher order signal In[9:2], and a lower order signal In[1:0] in this example, where N is 10 and M is 2. The higher order decoder 41 generates $2^{N-M}$ outputs Dec_1[255:0] each of which is supplied to a corresponding pass transistor in the first group of pass transistors. The lower order decoder 42 generates $2^M$ outputs Dec_2[3:0], each of which is supplied to corresponding pass transistor in the second group of pass transistors. The decoder operates to supply gate voltage to selected pairs of pass transistors for each value of the digital input. Each selected pair includes a selected pass transistor in the first group selected in response to the N−M higher order bits of the digital input, and a selected pass transistor in the second group selected in response to the M lower order bits in the digital input.

In the embodiment illustrated in FIG. 1, each of the pass transistors 3-0, 3-1, 3-2, 3-3 is configured according to its location in the circuit so that it has an effective size to reduce variations in sums of on-resistances $R_{ON}$ of the pass transistors in different selected pairs of pass transistors. The effective sizes can be configured by variations in the width w and length l of the transistor channels, and variations in the number m of transistor channels used for each pass transistor. Thus, as illustrated in FIG. 1, pass transistor 3-3 is configured according to the variables (w, l, m)$_3$; pass transistor 3-2 is configured according to the variables (w, l, m)$_2$; pass transistor 3-1 is configured according to the variables (w, l, m)$_1$; and pass transistor 3-0 is configured according to the variables (w, l, m)$_0$. The effective sizes of the transistors can be set using other geometric features of the transistors as well, in which the on-resistance of the transistor is a function of the effective size.

In operation, the circuit shown in FIG. 1 generates an output voltage VOUT that is a function of VREF and the resistors left in the current path by the selected pair of pass transistors. When the higher order bits are [00000000], Dec_1[0] is asserted turning on pass transistor 2-0, which bypasses the first set 12 of resistors connecting higher order voltage node VH[0] to the second node 13 so that the subset of resistors selected from the first set is equal to the empty set. When the higher order bits indicate an intermediate value such as [00000010], then Dec_1[2] is asserted turning on pass transistor 2-2, connecting higher order voltage node VH[2] to the second node 13, and bypassing the resistors below higher order voltage node VH[2] via pass transistor 2-2, so that the subset of resistors selected from the first set is equal to includes two members. When the higher order bits indicate the maximum [11111111] for this configuration, then Dec_1[255] is asserted connecting higher order voltage node VH[255] to the second node 13 via pass transistor 2-225 so that the subset of resistors selected from the first set is equal to the first set.

Also, when the lower order bits are [00], Dec_2[0] is asserted turning on pass transistor 3-0, connecting the lower order voltage node VL[0] to the second node 13, so that the subset of resistors selected from the second set is equal to the empty set. When the lower order bits are [01], Dec_2[1] is asserted turning on pass transistor 3-1, connecting the lower order voltage node VL[1] to the second node 13. When the lower order bits are [10], Dec_2[2] is asserted turning on pass transistor 3-2, connecting the lower order voltage node VL[2] to the second node 13. When the lower order bits are [11], Dec_2[3] is asserted turning on pass transistor 3-3, connecting the lower order voltage node VL[3] to the second node 13.

Thus, for each of the $2^N$ voltage levels to be generated by the N-bit DAC, a pair of pass transistors is selected by the higher order and lower order decoders.

The selected pair of pass transistors determines the number of resistors in the subset of the first set of resistors, and the number of resistors in the subset of the second set of resistors that are included in the feedback path for the amplifier.

The sum of the resistances of the resistors between the output node 11 and the feedback node 15, with the resistances of the selected pair of pass transistors, can be referred to as R1. The resistance of the reference resistor RREF can be referred to as R2. The output voltage generated by the operational amplifier configured as shown in FIG. 1 as a negative feedback, positive gain circuit can be determined by the function:

$$VOUT = VREF(1 + R1/R2). \quad \text{Eq. 1}$$

The value of R1 changes according to the selected pair of pass transistors. For an accurate DAC, it is desirable that each step in the digital input results in a corresponding uniform step in the analog output VOUT. The accuracy of these steps is largely a function of the uniformity of the resistors RD in the first set of resistors, for the higher order bits, and the uniformity of the resistors RD/M in the second set of resistors. However, in this circuit, the accuracy also depends on the uniformity of the sum of the on-resistance $R_{ON}$ of the selected pair of pass transistors.

The on-resistance $R_{ON}$ of the pass transistors can be characterized for the purposes of this description by the following equation:

$$R_{ON} = \frac{1}{k'\left(\frac{W}{L}\right)(VGS - Vt)} \quad \text{Eq. 2}$$

In Equation 2, k' is a constant. Vt is the threshold voltage of a MOSFET. VGS is the gate to source voltage applied to the MOSFET. The parameter (W/L) represents a configuration of the channel that corresponds to the effective size of the transistor, which is a function of the (w, l, m) parameters which define the width w, length l and number m of channels as discussed above.

Since the voltage $V_{GS}$ of each of the pass transistors in the first group of pass transistors depends on the voltage at the second node 13, and that voltage varies as a function of the selected one of the pass transistors in the second group of pass transistors. Therefore, the $V_{GS}$ and the on-resistance $R_{ON}$ of the pass transistors in the first group varies as a function of the lower order bits of the input signal.

Also, the threshold voltage Vt is a function according to the body effect of the voltage $V_{SB}$ across the source terminal and the body of MOSFET pass transistors. Variations therefore, in the source voltage at the second node 13 can have an impact on variations in the threshold voltage Vt, and as a result, variations in the on-resistance $R_{ON}$, in some configurations. Thus, the on-resistance varies as a function of lower order bits of the digital input, as does the voltage at node 13.

The following table illustrates how the sums of the on-resistances of pairs transistors are made more uniform in one embodiment.

| Code | Ron(1st) | Ron(2nd) | Ron(1st + 2nd) |
| --- | --- | --- | --- |
| 0 | Ron(VGS0,VSB0,W/L) | Ron(VGS0,VSB0,(W/L)0) | Ron_Constant |
| 1 | Ron(VGS1,VSB1,W/L) | Ron(VGS1,VSB1,(W/L)1) | Ron_Constant |
| 2 | Ron(VGS2,VSB2,W/L) | Ron(VGS2,VSB2,(W/L)2) | Ron_Constant |
| 3 | Ron(VGS3,VSB3,W/L) | Ron(VGS3,VSB3,(W/L)3) | Ron_Constant |
| 4 | Ron(VGS0,VSB0,W/L) | Ron(VGS0,VSB0,(W/L)0) | Ron_Constant |
| 5 | Ron(VGS1,VSB1,W/L) | Ron(VGS1,VSB1,(W/L)1) | Ron_Constant |
| 6 | Ron(VGS2,VSB2,W/L) | Ron(VGS2,VSB2,(W/L)2) | Ron_Constant |
| 7 | Ron(VGS3,VSB3,W/L) | Ron(VGS3,VSB3,(W/L)3) | Ron_Constant |
| 8 | Ron(VGS0,VSB0,W/L) | Ron(VGS0,VSB0,(W/L)0) | Ron_Constant |

The first column of the table is the digital input, expressed in decimal form. The on-resistances of pass transistors in the first group shown in the second column is determined by variations in the gate to source voltages VGS0-VGS3 and the source to body voltages VSB0-VSB3, when the transistor size (W/L) is uniform.

The on-resistance of transistors in the second group as illustrated in the third column is likewise a function of variations in the gate-to-source voltages VGS0-VGS3 and the source-to-body voltages VSB0-VSB3 and by the effective sizes of the transistors (W/L)0 to (W/L)3 VGS and VSB vary less in the second group in the embodiment of FIG. 1. So by varying the effective sizes W/L, the on-resistance of a transistor in the second group can be adjusted.

In this way, the sum of on-resistances for any given pair of the pass transistors selected from first and second groups can be a constant Ron_Constant (within manufacturing and operating tolerances) as illustrated in the last column.

Figure 2:
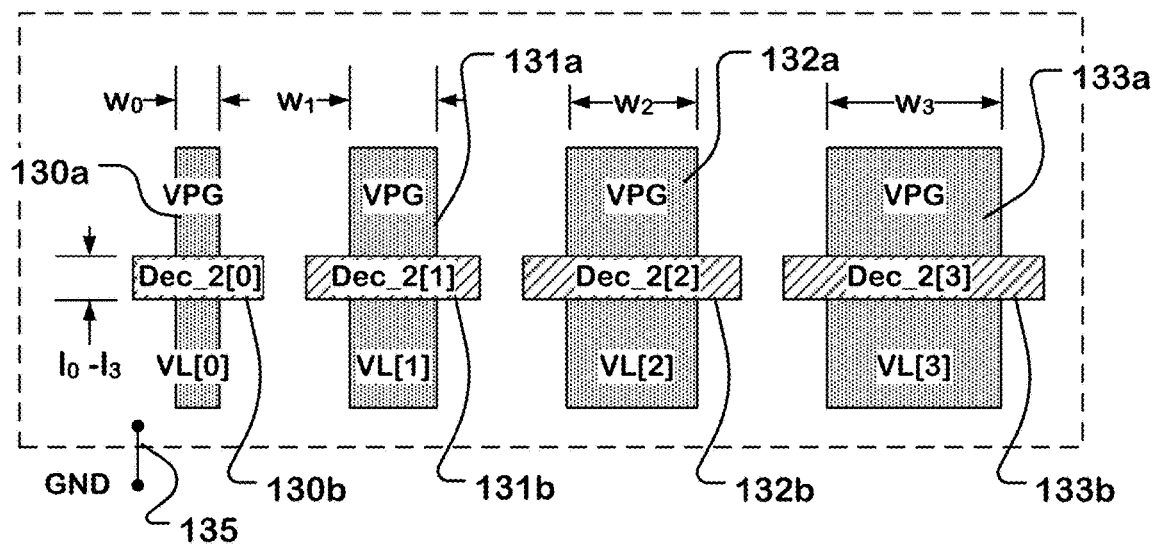
FIG. 2 is a layout diagram for pass transistors in the second group suitable for use in a circuit like that of FIG. 1.
Figure 3:
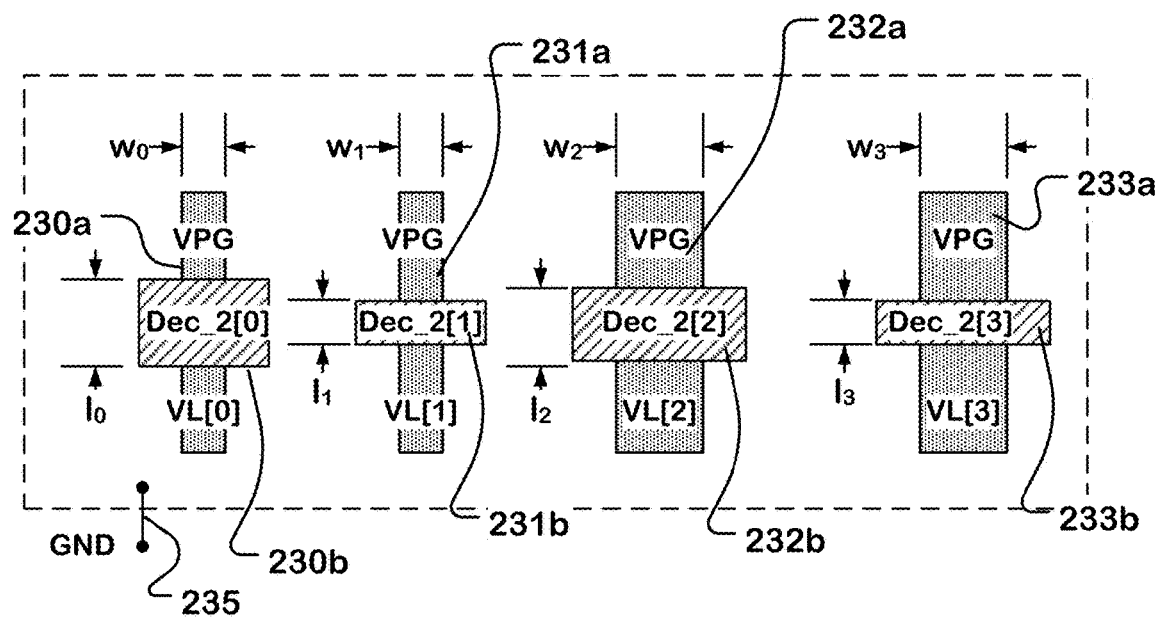
FIG. 3 is an alternative layout diagram for pass transistors in the second group suitable for use in a circuit like that of FIG. 1.
Figure 4:
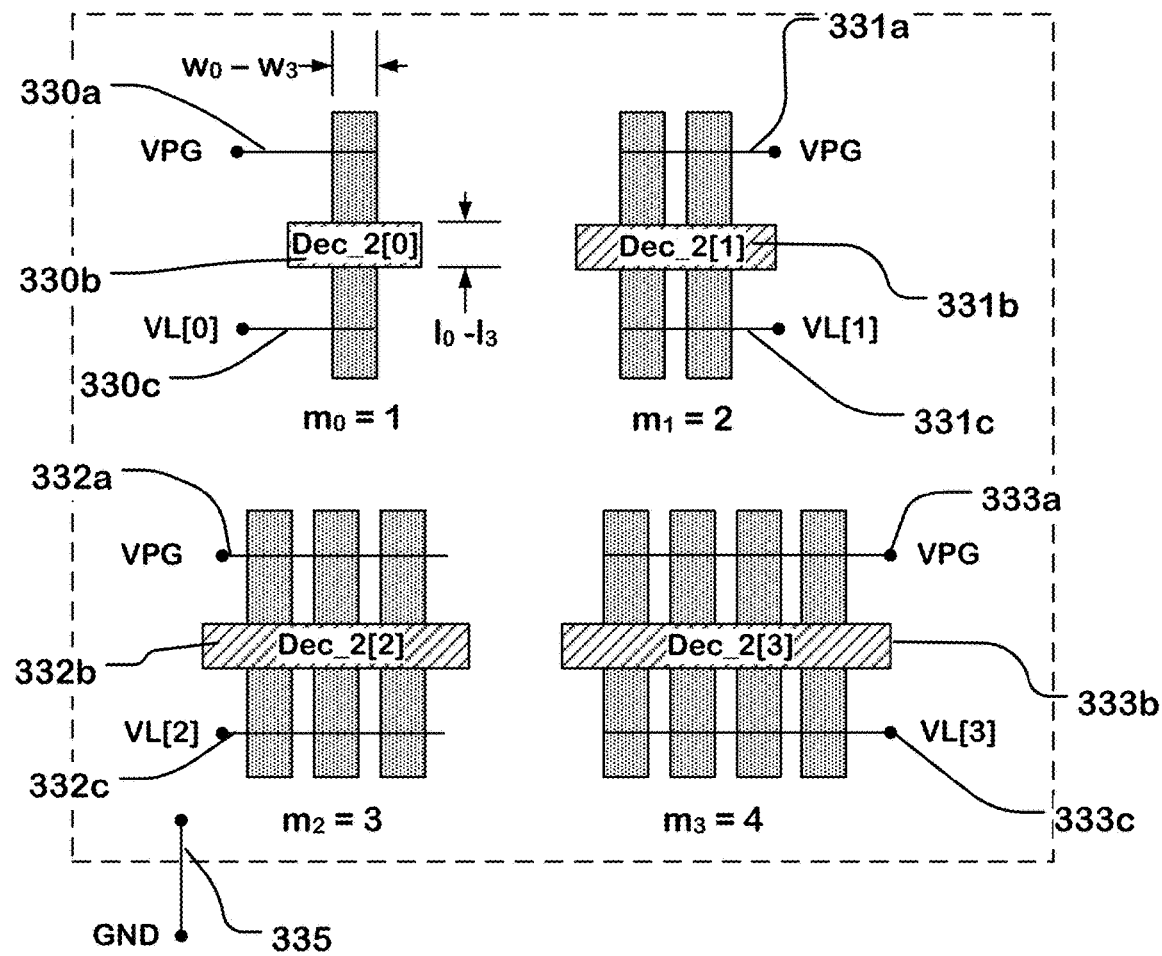
FIG. 4 is another alternative layout diagram for pass transistors in the second group suitable for use in a circuit like that of FIG. 1.

FIGS. 2-4 illustrate alternative configurations of the pass transistors in the second group, by which the effective size of the pass transistors can be set according to the logical position of the pass transistor in the circuit. For the purposes of this description, a larger effective size has a lower W/L, and therefore a lower on-resistance $R_{ON}$.

FIG. 2 illustrates an embodiment in which the pass transistors comprise active areas 130a, 131a, 132a and 133a of varying widths w0, w1, w2, w3, respectively. The lengths of the channels are determined by the widths of gates 130b, 131b, 132b and 133b, over the active areas, and in this example the lengths l0 to l3 are uniform. The channels and active areas of the pass transistors shown in FIG. 2 are disposed in a well 135 coupled to ground, which establishes a body voltage VB near ground for each of the pass transistors. In this example, the transistor having gate 133b has the largest effective size and is coupled to the signal Dec_2[3] corresponding to transistor 3-3 of FIG. 1. The transistor having gate 132b has the second largest effective size and is coupled to the signal Dec_2[2] corresponding to transistor 3-2 of FIG. 1. The transistor having gate 131b has the third largest effective size and is coupled to the signal Dec_2[1] corresponding to transistor 3-1 of FIG. 1. The transistor having gate 130b has the smallest effective size and is coupled to the signal Dec_2[0] corresponding to transistor 3-0 of FIG. 1.

This configuration compensates for not only the variations in on-resistance of the pass transistors in the first group of pass transistors, but also the variations in on-resistance of the pass transistors in the second group of pass transistors. When the transistor 3-3 is selected in the second group of pass transistors, the voltage VPG at node 13 corresponds to the lower order voltage node VL[3], which is the highest voltage level of the lower order voltage nodes. As a result, the overdrive VGS voltage on the selected pass transistor in the first group is (Dec_1[i]-VL[3]), which is the lowest of the overdrive voltages generated by the circuit. A similar effect is caused by selection of the other pass transistors in the second group, such that the overdrive VGS voltage of the selected pass transistor in the first group is a function of the lower order bits of the input digital signal. The effective sizes of the transistors in the second group are set therefore to compensate for these variations in overdrive voltage so that variations in the sum of the on-resistance of among the selected pairs of transistors are reduced, and the sum can be approximately the same for any selected pair. As a result, the step size of the output voltage for the DAC is made more uniform.

FIG. 3 illustrates an alternative embodiment, in which the pass transistors comprise active areas 230a, 231a, 232a and 233a of varying widths w0, w1, w2, w3, respectively, where w0 and w1 are one width and w2 and w3 are a different width. The lengths of the channels are determined by the widths of gates 230b, 231b, 232b and 233b, over the active areas, and in this example the lengths l0 to l3 vary. The channels and active areas of the pass transistors shown in FIG. 3 are disposed in a well 235 coupled to ground, which establishes a body voltage VB near ground for each of the pass transistors. In this example, the transistor having gate 233b has the largest effective size and is coupled to the signal Dec_2[3] corresponding to transistor 3-3 of FIG. 1. The transistor having gate 232b has the second largest effective size and is coupled to the signal Dec_2[2] corresponding to transistor 3-2 of FIG. 1. The transistor having gate 231b has the third largest effective size and is coupled to the signal Dec_2[1] corresponding to transistor 3-1 of FIG. 1. The transistor having gate 230b has the smallest effective size and is coupled to the signal Dec_2[0] corresponding to transistor 3-0 of FIG. 1.

FIG. 4 illustrates an alternative embodiment, in which the pass transistors comprise variable numbers of channels such as can be implemented using finFET techniques and other layout techniques, having source regions 330a, 331a, 332a and 333a, and drain regions 330c, 331c, 332c and 333c, coupled together to form, in effect, single transistors. The effective size of the transistors is a function of the number m of channel lines. The lengths of the channels are determined by the widths of gates 330b, 331b, 332b and 333b, over the active areas, and in this example the lengths are the same. The channels and active areas of the pass transistors shown in FIG. 4 are disposed in a well 335 coupled to ground, which establishes a body voltage VB near ground for each of the pass transistors. In this example, the transistor having gate 333b has the largest effective size and is coupled to the signal Dec_2[3] corresponding to transistor 3-3 of FIG. 1. The transistor having gate 332b has the second largest effective size and is coupled to the signal Dec_2[2] corresponding to transistor 3-2 of FIG. 1. The transistor having gate 331b has the third largest effective size and is coupled to the signal Dec_2[1] corresponding to transistor 3-1 of FIG. 1. The transistor having gate 330b has the smallest effective size and is coupled to the signal Dec_2[0] corresponding to transistor 3-0 of FIG. 1.

Figure 5:
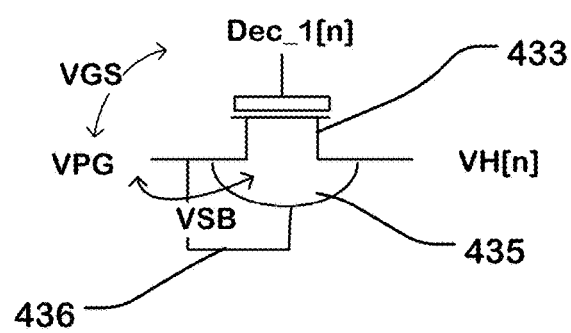
FIG. 5 illustrates a triple well transistor suitable for use in a circuit like that of FIG. 1.

FIG. 5 illustrates schematically a triple well transistor, in which the source terminal is coupled to the body so that the source to body voltage VSB is 0 V independent of the voltage on the source. The triple well transistor 433 includes an isolated well 435 within which the channel and the source and drain terminals are implemented in a manner that isolates them from the bulk semiconductor body. In this way, the source terminal 436 can be connected directly to the isolated well 435, making VSB equal to 0 V. In some embodiments, the transistors in the first group of pass transistors are implemented using triple well transistors to eliminate variations in the on-resistance that arise from changes in threshold voltage due to the body effect. In some embodiments all of the pass transistors in the first group and second group are implemented using triple well transistors.

In an embodiment like that of FIG. 1, the decoder generates a constant voltage such as VDD as the gate voltage for any selected pass transistor in the first group and in the second group. Thus, the gate to source overdrive voltage and the source to substrate voltage for any given input code can vary as shown in the following table.

| Code | VG | VS | VB | VGS | VSB |
|---|---|---|---|---|---|
| 0 | VDD | VL[0] | 0 | VDD-VL[0] | VL[0] |
| 1 | VDD | VL[0] + Vstep | 0 | VDD-VL[0]-Vstep | VL[0] + Vstep |
| 2 | VDD | VL[0] + 2 * Vstep | 0 | VDD-VL[0]-2 * Vstep | VL[0] + 2 * Vstep |
| 3 | VDD | VL[0] + 3 * Vstep | 0 | VDD-VL[0]-3 * Vstep | VL[0] + 3 * Vstep |
| 4 | VDD | VL[0] | 0 | VDD-VL[0] | VL[0] |
| 5 | VDD | VL[0] + Vstep | 0 | VDD-VL[0]-Vstep | VL[0] + Vstep |
| 6 | VDD | VL[0] + 2 * Vstep | 0 | VDD-VL[0]-2 * Vstep | VL[0] + 2 * Vstep |
| 7 | VDD | VL[0] + 3 * Vstep | 0 | VDD-VL[0]-3 * Vstep | VL[0] + 3 * Vstep |
| 8 | VDD | VL[0] | 0 | VDD-VL[0] | VL[0] |

In the table, the code is the digital input in decimal form. The gate voltage VG is constant at VDD. The voltage Vstep corresponds to the voltage step that occurs by selecting each additional resistor in the second set of resistors having the resistance value RD/4. There are four steps in this example. The source voltage VS in the third column corresponds to the voltage VPG at node 13 in the circuit of FIG. 1. The code in the first column corresponds to the three lower order bits of the input digital signal In[9:0], and repeats in the four step pattern throughout the full range. The body voltage VB is ground in this example, and the gate-to-source voltage VGS is listed in the fifth column. The source-to-substrate voltage VSB is listed in the fourth column. These variations in VGS and VSB, particularly for transistors in the first group, can have an impact on the on-resistance of the transistors, as discussed above.

Figure 6:
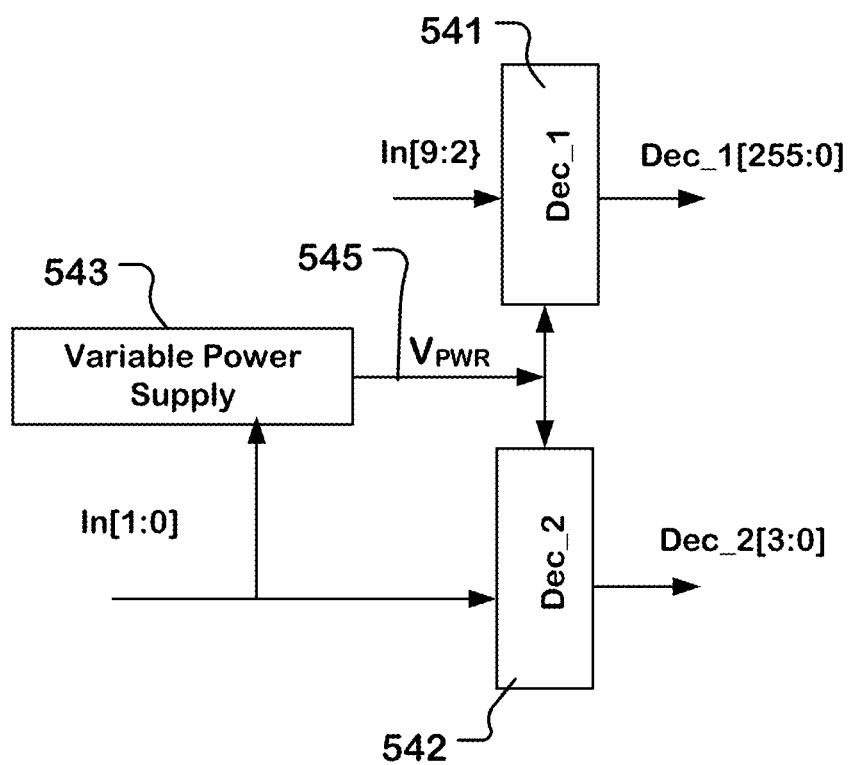
FIG. 6 illustrates an alternative decoder configuration which can be used in a circuit like that of FIG. 1.

FIG. 6 illustrates an alternative implementation for the decoder used to generate the gate voltages for the pass transistors in the first and second groups. The decoder includes a higher order decoder 541 and a lower order decoder 542. The digital input signal In[N−1:0] is divided into a higher order signal In[9:2], and a lower order signal In[1:0] in this example, where N is 10 and M is 2. The higher order decoder 541 generates $2^{N-M}$ outputs Dec_1[255:0] each of which is supplied to a corresponding pass transistor in the first group of pass transistors. The lower order decoder 542 generates $2^M$ outputs Dec_2[3:0], each of which is supplied to a corresponding pass transistor in the second group of pass transistors. The decoder operates to supply gate voltages to different selected pairs of pass transistors for different values of the digital input. Each selected pair includes a selected pass transistor in the first group, selected in response to the N−M higher order bits of the digital input, and a selected pass transistor in the second group, selected in response to the M lower order bits in the digital input. In this embodiment, the decoder includes a variable power supply 543 that generates the supply voltage VPWR on line 545 used to drive the higher order decoder and the lower order decoder, so that the voltages Dec_1[255:0] have levels that are a function of the lower order input bits In[1:0]. The higher order decoder 541 includes a circuit acting as a switch connecting output VPWR, or a function of VPWR, to the decoder output selected as the gate voltage for the selected pass transistor in the first group. In some embodiments, the voltage levels Dec_2[3:0] applied to all the pass gates in the second group are maintained constant. In other embodiments, the voltage levels applied to the second group of transistors can vary as well, as a function of the digital input.

This decoder can compensate for the variations in on-resistance of the pass transistors in the first group of pass transistors. When the transistor 3-0 is selected in the second group of pass transistors, the voltage VPG at node 13 corresponds to the lower order voltage node VL[0], which is the lowest of the lower order voltage nodes. The decoder in response to the input bits In[1:0] selecting pass transistor 3-0, generates a voltage Dec_[i] that is set at the lowest value to compensate for the voltage VL[0]. When the transistor 3-1 is selected in the second group of pass transistors, the voltage VPG at node 13 corresponds to the lower order voltage node VL[1], which is the third highest of the lower order voltage nodes. The decoder in response to the input bits In[1:0] selecting pass transistor 3-1, generates a voltage Dec_2[i] that is increased by a first amount to compensate for the voltage VL[1]. When the transistor 3-2 is selected in the second group of pass transistors, the voltage VPG at node 13 corresponds to the lower order voltage node VL[2], which is the second highest of the lower order voltage nodes. The decoder in response to the input bits In[1:0] selecting pass transistor 3-2, generates a voltage Dec_2[i] that is increased by a second amount to compensate for the voltage VL[2]. When the transistor 3-3 is selected in the second group of pass transistors, the voltage VPG at node 13 corresponds to the lower order voltage node VL[3], which is the highest of the lower order voltage nodes. The decoder in response to the input bits In[1:0]selecting pass transistor 3-3, generates a voltage Dec_2[i] that is increased by a third amount to compensate for the voltage VL[3].

The following table illustrates a manner in which varying the voltage VPWR can make a more uniform gate to source voltage on the pass transistors, from use of the decoder like that of FIG. 6.

| Code | VG = PWR | VS | VB | VGS | VSB |
|------|----------|-----|-----|-----|-----|
| 0 | Vod + VL[0] | VL[0] | VL[0] | Vod | 0 |
| 1 | Vod + VL[0] + Vstep | VL[0] + Vstep | VL[0] | Vod | 0 |
| 2 | Vod + VL[0] + 2 * Vstep | VL[0] + 2 * Vstep | VL[0] | Vod | 0 |
| 3 | Vod + VL[0] + 3 * Vstep | VL[0] + 3 * Vstep | VL[0] | Vod | 0 |
| 4 | Vod + VL[0] | VL[0] | VL[0] | Vod | 0 |
| 5 | Vod + VL[0] + Vstep | VL[0] + Vstep | VL[0] | Vod | 0 |
| 6 | Vod + VL[0] + 2 * Vstep | VL[0] + 2 * Vstep | VL[0] | Vod | 0 |
| 7 | Vod + VL[0] + 3 * Vstep | VL[0] + 3 * Vstep | VL[0] | Vod | 0 |
| 8 | Vod + VL[0] | VL[0] | VL[0] | Vod | 0 |

In the table, the code is the digital input in decimal form. The gate voltage VG on the pass transistor in the first group is set out in the second column. The source voltage VS corresponds to the voltage at the corresponding node on the resistors string in the first group, as determined by the lower order bits of the input. The substrate voltage is VL[0] in this example established by coupling the well to the VL[0] node. As a result, the VGS is equal to overdrive voltage Vod, and the source-to-substrate VSB voltage on the selected pass transistor is close to a constant 0 volts, varying only the Vstep voltages listed. Also, in some embodiments, the pass transistors can be implemented using triple well transistors, making VSB equal to zero.

The decoder circuit of FIG. 6 can be utilized alone or in combination with the variations in the effective sizes of the pass transistors in the second group, as a means for reducing variations in a sum of on-resistances $R_{ON}$ of the selected pairs of pass transistors.

In the embodiments described herein, the DAC comprises two stages. Utilizing the techniques described herein to reduce or eliminate variations in the on-resistance of the pass transistors between the stages, a resistor string DAC can be implemented using two or more stages.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An N-bit digital-to-analog converter DAC, comprising:
   a first stage including a first set of resistors corresponding to higher order bits of a digital input;
   a second stage including a second set of resistors corresponding to lower order bits of the digital input;
   a plurality of pass transistors arranged to connect a first subset of the first set of resistors in the first stage selected in response to the digital input to a second subset of the second set of resistors in the second stage selected in response to the digital input, wherein pass transistors in the plurality of pass transistors have different effective sizes, arranged to reduce variations in sums of on-resistances $R_{ON}$ of transistors in the plurality of pass transistors used to connect different selected subsets of the second set of resistors, wherein the plurality of pass transistors includes a first group of pass transistors having ($2^{N-M}$) members, the pass transistors in the first group connected between respective nodes of the resistors in the first set and an intermediate node, and a second group of pass transistors having ($2^M$) members, the pass transistors in the second group connected between the intermediate node and respective nodes of the resistors in the second set.

2. The DAC of claim 1, including an amplifier having a first input connected to a voltage reference and a second input connected to a feedback signal, and generating an output voltage on an output node;

wherein the first set of resistors is connected in series between the output node and a second node, the first set having ($2^{N-M}-1$) members, and the second set of resistors is connected in series between the second node and a third node, the second set having ($2^M-1$) members; and a feedback circuit connected between the third node and a power supply reference voltage, which provides the feedback signal as a function of voltage at the third node.

3. The DAC of claim 1, including:

a decoder connected to a digital input, and supplying gate voltages to different selected pairs of pass transistors for different values of the digital input, each selected pair including pass transistor in the first group selected in response to N–M higher order bits of the digital input, and to a pass transistor in the second group selected in response to M lower order bits in the digital input.

4. The DAC of claim 3, wherein the decoder is arranged to apply a gate voltage to the selected pass transistor in the first group having a voltage level that is a function of the M lower order bits of the digital input.

5. The DAC of claim 1, wherein the pass transistors in the second group include transistors T(i), for i from $2^M$ to 1, connected respectively to outputs of the decoder corresponding to decoded values of the lower order M input bits of the digital input, and the effective size of transistor T(i) is greater than the effective size of transistor T(i–1).

6. The DAC of claim 1, wherein the pass transistors in the first group have a common channel configuration, and the channel configurations of pass transistors in the second group vary to offset variations in $R_{ON}$ of the first group due to variations of overdrive voltage on the pass transistors in the first group.

7. The DAC of claim 1, wherein the pass transistors in the first group comprise triple well transistors having source terminals connected to their respective channel wells.

8. The DAC of claim 1, wherein the pass transistors in the plurality of pass transistors comprise triple well transistors having source terminals connected to their respective channel wells.

9. A method for manufacturing an N bit digital-to-analog converter DAC, comprising:

forming a first stage including a first set of resistors corresponding to higher order bits of the digital input;

forming a second stage including a second set of resistors corresponding to lower order bits of the digital input;

forming a plurality of pass transistors arranged to connect a first subset of the first set of resistors in the first stage selected in response to the digital input to a second subset of the second set of resistors in the second stage selected in response to the digital input, wherein pass transistors in the plurality of pass transistors have different effective sizes, arranged to reduce variations in sums of on-resistances $R_{ON}$ of pass transistors in the plurality of pass transistors used to connect different selected subsets of the second set of resistors, wherein the plurality of pass transistors includes a first group of pass transistors having ($2^{N-M}$) members, the pass transistors in the first group connected between respective nodes of the resistors in the first set and an intermediate node, and a second group of pass transistors having ($2^M$) members, the pass transistors in the second group connected between the intermediate node and respective nodes of the resistors in the second set.

10. The method of claim 9, including forming an amplifier having a first input connected to a voltage reference and a second input connected to a feedback signal, and generating an output voltage on an output node;

wherein the first set of resistors is connected in series between the output node and a second node, the first set having ($2^{N-M}-1$) members, and the second set of resistors is connected in series between the second node and a third node, the second set having ($2^M-1$) members; and forming a feedback circuit connected between the third node and a power supply reference voltage, which provides the feedback signal as a function of voltage at the third node.

11. The method of claim 9, including:

forming a decoder connected to a digital input, which supplies gate voltages to different selected pairs of pass transistors for different values of the digital input, each selected pair including pass transistor in the first group selected in response to N–M higher order bits of the digital input, and to a pass transistor in the second group selected in response to M lower order bits in the digital input.

12. The method of claim 11, wherein the decoder is arranged to apply a gate voltage to the selected pass transistor in the first group having a voltage level that is a function of the M lower order bits of the digital input.

13. The method of claim 9, wherein the pass transistors in the second group include transistors T(i), for i from $2^M$ to 1, connected respectively to outputs of the decoder corresponding to decoded values of the lower order M input bits of the digital input, and the effective size of transistor T(i) is greater than the effective size of transistor T(i–1).

14. The method of claim 9, wherein the pass transistors in the first group have a common channel configuration, and the channel configurations of pass transistors in the second group vary to offset variations in $R_{ON}$ of the first group due to variations of overdrive voltage on the pass transistors in the first group.

15. The method of claim 9, wherein the pass transistors in the first group comprise triple well transistors having source terminals connected to their respective channel wells.

16. The method of claim 9, wherein the pass transistors in the plurality of pass transistors comprise triple well transistors having source terminals connected to their respective channel wells.

17. An N bit digital-to-analog converter DAC, comprising:

a first stage including a first set of resistors corresponding to higher order bits of a digital input;

a second stage including a second set of resistors corresponding to lower order bits of the digital input;

a plurality of pass transistors arranged to connect a first subset of the first set of resistors in the first stage selected in response to the digital input to a second subset of the second set of resistors in the second stage selected in response to the digital input, wherein the plurality of pass transistors includes a first group of pass transistors having ($2^{N-M}$) members, the pass transistors in the first group connected between respective nodes of the resistors in the first set and an intermediate node, and a second group of pass transistors having ($2^M$) members, the pass transistors in the second group connected between the intermediate node and respective nodes of the resistors in the second set; and means for reducing variations in a sum of on-resistances $R_{ON}$ of the pass transistors in the plurality of pass transistors selected in response to the digital input.

18. An N-bit digital-to-analog converter DAC, comprising:

an amplifier having a first input connected to a voltage reference and a second input connected to a feedback signal, and generating an output voltage on an output node;

a first set of resistors corresponding to higher order bits of a digital input connected in series between the output node and a second node;

a second set of resistors corresponding to lower order bits of the digital input connected in series between the second node and a third node;

a plurality of pass transistors arranged to connect a first subset of the first set of resistors in the first stage selected in response to the digital input to a second subset of the second set of resistors in the second stage selected in response to the digital input, wherein pass transistors in the plurality of pass transistors have different effective sizes, arranged to reduce variations in sums of on-resistances $R_{ON}$ of transistors in the plurality of pass transistors used to connect different selected subsets of the second set of resistors; and a feedback circuit connected between the third node and a power supply reference voltage, which provides the feedback signal as a function of voltage at the third node.

* * * * *